United States Patent
Lee et al.

(10) Patent No.: US 9,521,760 B2
(45) Date of Patent: Dec. 13, 2016

(54) RIGID FLEXIBLE PRINTED CIRCUIT BOARD AND METHOD OF MANUFACTURING THE SAME

(71) Applicant: SAMSUNG ELECTRO-MECHANICS CO., LTD., Suwon (KR)

(72) Inventors: Yang Je Lee, Suwon (KR); Jee Hoon Kim, Suwon (KR); Jae Ho Shin, Suwon (KR); Hyung Ju Cho, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 14/282,490

(22) Filed: May 20, 2014

(65) Prior Publication Data

US 2014/0345911 A1   Nov. 27, 2014

(30) Foreign Application Priority Data

May 27, 2013   (KR) .................. 10-2013-0060007

(51) Int. Cl.
    *H05K 3/46*         (2006.01)
(52) U.S. Cl.
    CPC ............ *H05K 3/4691* (2013.01); *Y10T 156/10* (2015.01)
(58) Field of Classification Search
    CPC ..... H05K 1/028; H05K 1/0298; H05K 3/4626
    USPC .................. 174/251, 254; 216/20; 156/60
    See application file for complete search history.

(56) References Cited

U.S. PATENT DOCUMENTS

| 5,004,639 A   * | 4/1991  | Desai ...................... B32B 7/02 174/254 |
| 5,499,444 A   * | 3/1996  | Doane, Jr. ............ H05K 3/4691 156/252 |
| 8,405,999 B2  * | 3/2013  | Takahashi ............ H05K 3/4691 174/262 |
| 8,693,202 B2  * | 4/2014  | Yoshifusa .............. H05K 1/118 174/254 |
| 2001/0010303 A1 * | 8/2001 | Caron .................. H05K 3/4691 216/18 |
| 2004/0258899 A1 * | 12/2004 | Takeuchi .................. C08J 5/24 428/292.1 |

(Continued)

FOREIGN PATENT DOCUMENTS

| KR | 10105149  | * 10/2009 |
| KR | 101051491 | * 10/2009 |
| KR | 101319808 | *  2/2012 |

OTHER PUBLICATIONS

Korean Office Action issued Apr. 15, 2014 in corresponding Korean Patent Application No. 10-2013-0060007.

(Continued)

*Primary Examiner* — Michael F McAllister
(74) *Attorney, Agent, or Firm* — NSIP Law

(57) ABSTRACT

A rigid flexible printed circuit board, having a rigid region and a flexible region, includes, in one embodiment: a base substrate including a portion in the rigid region and a portion in the flexible region; a coverlay formed on the base substrate; a first insulating layer formed on the coverlay and formed in the rigid region; a second insulating layer formed on the first insulating layer; and an outer layer circuit layer formed on the second insulating layer. Also described is a method of manufacturing a rigid flexible printed circuit board having a rigid region and a flexible region.

14 Claims, 13 Drawing Sheets

(56) References Cited

U.S. PATENT DOCUMENTS

2008/0014768 A1    1/2008  Lee et al.
2012/0285732 A1*  11/2012  Takeuchi ............. H05K 1/0278
                                                                                                      174/254
2013/0220535 A1*   8/2013  Lee ...................... H05K 3/4691
                                                                                                      156/268

OTHER PUBLICATIONS

English Abstract of Korean Patent No. 10-0789531 issued Dec. 20, 2007.
English Abstract of Korean Patent Publication No. 10-2011-0045991 published May 4, 2011.
Japanese Office Action dated Dec. 9, 2014 in corresponding Japanese Patent Application No. 2014-106033.
English Abstract of Japanese Publication No. 2006-332280, Published Dec. 7, 2006.
English Abstract of Japanese Publication No. 2013-074270, Published Apr. 22, 2013.

* cited by examiner

RIGID FLEXIBLE PRINTED CIRCUIT BOARD AND METHOD OF MANUFACTURING THE SAME

CROSS-REFERENCE TO RELATED APPLICATIONS

This application claims the foreign priority benefit of Korean Patent Application No. 10-2013-0060007, filed on May 27, 2013, entitled "Rigid Flexible Printed Circuit Board And Method Of Manufacturing The Same", which is hereby incorporated by reference in its entirety into this application.

BACKGROUND

1. Field

Embodiments of the present invention relate to a rigid flexible printed circuit board and a method of manufacturing the same.

2. Description of the Related Art

Recently, high-pixel cameras has been adopted in mobile devices. Such high-pixel cameras may have a resolution of 13 million pixels or other resolutions beyond 10 million pixels. As a camera module substrate for mobile devices, a rigid flexible substrate may be used (US Patent Laid-Open Publication No. 2008-0014768). The rigid flexible substrate is divided into a rigid portion at which sensors and components are mounted and a flexible portion which is a curved portion so as to be efficiently disposed in a narrow space; thus, the substrate is efficiently used. Recently, a high-performance and high-pixel camera module having a resolution beyond 10 million pixels has been mounted as a main camera. At the time of manufacturing the camera module, flatness of the substrate is very important. The reason is that when flatness of an image sensor is not secured, a focus mismatch between the image sensor and a lens may occur. When the focus mismatch does not occur, a problem of focusing which partially causes blurring of an image may occur.

SUMMARY

Embodiments of the present invention have been made in an effort to provide a rigid flexible printed circuit board with improved flatness and a method of manufacturing the same.

Further, the embodiments have been made in an effort to provide a rigid flexible printed circuit board capable of preventing voids from occurring and a method of manufacturing the same.

According to an embodiment of the present invention, there is provided a rigid flexible printed circuit board including: a base substrate including a rigid region and a flexible region; a coverlay formed on the base substrate; a first insulating layer formed on the coverlay and formed in the rigid region; a second insulating layer formed on the first insulating layer; and an outer layer circuit layer formed on the second insulating layer.

The first insulating layer may be laminated in a B stage and then hardened.

The second insulating layer may be a C-stage insulating layer.

The base substrate may include an internal insulating layer and an inner layer circuit layer which is formed on the internal insulating layer.

The rigid flexible printed circuit board may further include: a via electrically connecting the inner layer circuit layer to the outer layer circuit layer by penetrating through the first insulating layer, the second insulating layer, and the coverlay.

The rigid flexible printed circuit board may further include: a solder resist layer formed on the second insulating layer to bury the outer layer circuit layer.

The coverlay may be attached to the base substrate by an adhesive which is formed on one surface of the coverlay.

According to another embodiment of the present invention, there is provided a rigid flexible printed circuit board, including: a base substrate including a rigid region and a flexible region; a coverlay formed on the base substrate; a stop pattern formed on the coverlay of the rigid region and having a side surface exposed in the flexible region; a first insulating layer formed on the coverlay and formed in the rigid region; and an outer layer circuit layer formed on the first insulating layer.

The base substrate may include an internal insulating layer and an inner layer circuit layer which is formed on the internal insulating layer.

The rigid flexible printed circuit board may further include: a first via electrically connecting the inner layer circuit layer to the outer layer circuit layer by penetrating through the first insulating layer and the coverlay.

The rigid flexible printed circuit board may further include: a solder resist layer formed on the second insulating layer to bury the outer layer circuit layer.

The coverlay may be attached to the base substrate by an adhesive which is formed on one surface of the coverlay.

The rigid flexible printed circuit board may further include: an adhesive layer formed between the coverlay and the first insulating layer.

The rigid flexible printed circuit board may further include: a first circuit layer formed on the coverlay to be buried in the first insulating layer.

The rigid flexible printed circuit board may further include: a second via electrically connecting the first circuit layer to the outer layer circuit layer by penetrating through the first insulating layer.

According to still another embodiment of the present invention, there is provided a method of manufacturing a rigid flexible printed circuit board, including: providing a base substrate including a rigid region and a flexible region; forming a coverlay on the base substrate; forming a B-stage first insulating layer on the coverlay formed in the rigid region; forming a C-stage second insulating layer on the first insulating layer; hardening the first insulating layer; and forming an outer layer circuit layer on the second insulating layer.

In the forming of the first insulating layer, the first insulating layer may be attached to the coverlay in a punched state so that the flexible region is opened.

In the forming of the second insulating layer, the second insulating layer may be attached to the first insulating layer in a punched state so that the flexible region is opened.

In the providing of the base substrate, the base substrate may include an internal insulating layer and an inner layer circuit layer which is formed on the internal insulating layer.

The forming of the outer layer circuit layer may further include forming a via electrically connecting the outer layer circuit layer to the inner layer circuit layer.

In the forming of the coverlay, the coverlay may be attached to the base substrate by an adhesive formed on one surface of the coverlay.

According to still yet another embodiment of the present invention, there is provided a method of manufacturing a rigid flexible printed circuit board, including: providing a base substrate including a rigid region and a flexible region; forming a coverlay on the base substrate; forming a stop pattern on the coverlay of the flexible region; forming a C-stage first insulating layer on the coverlay and the stop pattern; etching the first insulating layer and the stop pattern of the flexible region; and forming an outer layer circuit layer on the first insulating layer of the rigid region.

In the providing of the base substrate, the base substrate may include an internal insulating layer and an inner layer circuit layer which is formed on the internal insulating layer.

The forming of the outer layer circuit layer may further include forming a first via electrically connecting the outer layer circuit layer to the inner layer circuit layer.

In the forming of the coverlay, the coverlay may be attached to the base substrate by an adhesive formed on one surface of the coverlay.

The method of manufacturing a rigid flexible printed circuit board may further include: after the forming of the coverlay, forming an adhesive layer on the coverlay.

The forming of the stop pattern may further include forming a first circuit layer on the coverlay of the rigid region.

The forming of the outer layer circuit layer may further include forming a second via electrically connecting the outer layer circuit layer to the first circuit layer.

In another aspect of the invention. a rigid flexible printed circuit board, having a rigid region and a flexible region, includes: a base substrate including a portion in the rigid region and a portion in the flexible region; a coverlay formed on the base substrate; an insulating layer formed in the rigid region and on the coverlay, the insulating layer having a boundary portion, at a boundary of the rigid region adjacent to the flexible region, that is on an intermediate member interposed between the boundary portion and the coverlay; and an outer layer circuit layer formed on the second insulating layer. A method of manufacturing this rigid flexible printed circuit board of claim may include: providing the base substrate and the coverlay on the base substrate; forming an intermediate layer on the coverlay so as to be in the flexible region and at least partly extending into the rigid region; forming the insulating layer on the intermediate member, the insulating layer being a C-stage insulating layer; and removing a portion of the insulating layer and a portion of the intermediate layer underlying the removed portion of the insulating layer, so as to expose the coverlay underneath and to form the flexible region of the printed circuit board.

Additional aspects and/or advantages will be set forth in part in the description which follows and, in part, will be apparent from the description, or may be learned by practice of the invention.

BRIEF DESCRIPTION OF THE DRAWINGS

The above and other aspects, features and advantages of the present invention will be more clearly understood from the following detailed description taken in conjunction with the accompanying drawings, in which.

DESCRIPTION OF EMBODIMENTS

Figure 1:
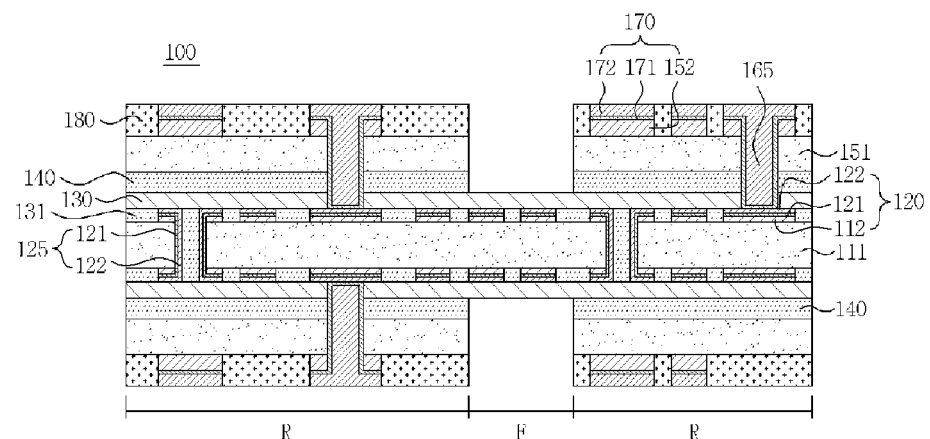
FIG. 1 is an exemplified diagram illustrating a rigid flexible printed circuit board according to an embodiment of the present invention.

The aspects, features and advantages of the present invention will be more clearly understood from the following detailed description of embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, embodiments of the present invention will be described in detail with reference to the attached drawings.

FIG. 1 is an exemplified diagram illustrating a rigid flexible printed circuit board according to an embodiment of the present invention.

Referring to FIG. 1, a rigid flexible printed circuit board 100 may include an internal insulating layer 111, an inner layer circuit layer 120, a coverlay 130, a first insulating layer 140, a second insulating layer 151, an outer layer circuit layer 170, and a solder resist layer 180.

The internal insulating layer 111 may be made of flexible insulating materials known to those skilled in the art. For example, the internal insulting layer 111 may be made of polyimide. An inside of the internal insulating layer 111 may be provided with a through via 125 which penetrates through the internal insulating layer 111. The internal insulating layer 111 may include a rigid region R and a flexible region F.

The inner layer circuit layer 120 may be formed on the internal insulating layer 111. The inner layer circuit layer 120 may include a first copper clad layer 112, a first seed layer 121, and a first plating layer 122. The inner layer circuit layer 120 may be made of conductive materials. The inner layer circuit layer 120 may be formed by applying a method of forming a circuit pattern known to those skilled in the art.

The coverlay 130 may be formed on the inner layer circuit layer 120. The coverlay 130 may be formed to protect the inner layer circuit layer 120 from the outside. To form the coverlay 130 on the inner layer circuit layer 120, an adhesive 131 may be applied among the internal insulating layer 111, the inner layer circuit layer 120, and the coverlay 130. The coverlay 130 may be formed of a polyimide film. Alternatively, the coverlay 130 may be formed of a photo imageable coverlay (PIC).

The first insulating layer 140 may be formed on the coverlay 130. The first insulating layer 140 may be formed in the rigid region R. The first insulating layer 140 may be a B-stage prepreg having flowability. The B-stage first insulating layer 140 may be hardened by being subjected to a pressing and heating process.

The second insulating layer 151 may be formed on the first insulating layer 140. The second insulating layer 151 may be formed by stacking the C-stage prepreg. The second insulating layer 151 may have high rigidity and a high glass transition temperature. For example, the glass transition temperature of the second insulating layer 151 may be 180° C. or more. According to the embodiment of the present invention, the insulating layer may be formed to have a double layered structure. That is, a thickness of the B-stage first insulating layer 140 may be reduced due to the second insulating layer 151.

The outer layer circuit layer 170 may be formed on the second insulating layer 151. The outer layer circuit layer 170 may be electrically connected to a first via 165 which penetrates through the first insulating layer 140 and the second insulating layer 151. The first via 165 may electrically connect the inner layer circuit layer 120 to the outer layer circuit layer 170. The outer layer circuit layer 170 may include a second copper clad layer 152, a second seed layer 171, and a second plating layer 172. The outer layer circuit layer 170 may be made of conductive materials. The outer layer circuit layer 170 may be formed by applying a method of forming a circuit pattern known to those skilled in the art.

The solder resist layer 180 may be formed to bury the outer layer circuit layer 170.

FIGS. 2 through 12 are exemplified diagrams showing a method for manufacturing a rigid flexible printed circuit board according to an embodiment of the present invention.

Figure 2:
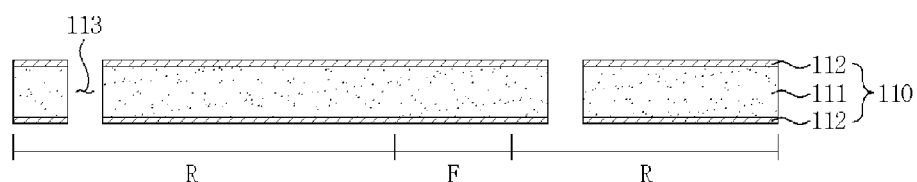
FIGS. 2 through 12 are exemplified diagrams showing a method for manufacturing a rigid flexible printed circuit board according to an embodiment of the present invention.

Referring to FIG. 2, a base substrate 110 on which a through hole 113 is formed may be provided. The base substrate 110 may be a flexible copper clad laminated (FCCL) plate formed of the internal insulating layer 111 and the first copper clad layer 112. The internal insulating layer 111 may be made of polyimide. The through hole 113 may be formed on the base substrate 110 by using CNC drill. The base substrate 110 may be divided into the rigid region R and the flexible region F.

Figure 3:
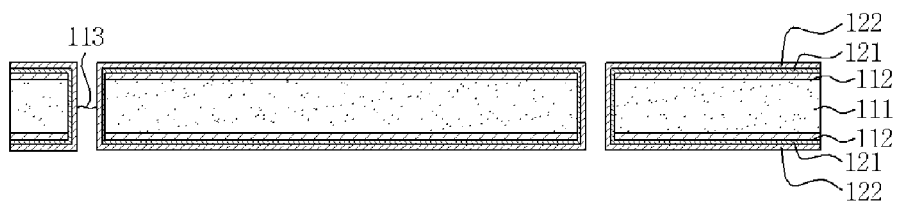

Referring to FIG. 3, the first seed layer 121 may be formed on an inner wall of the through hole 113 and on the first copper clad layer 112. The first seed layer 121 may be formed by an electroless plating method. The first plating layer 122 may be formed on the first seed layer 121. The first plating layer 122 may be formed by an electroplating method.

Figure 4:
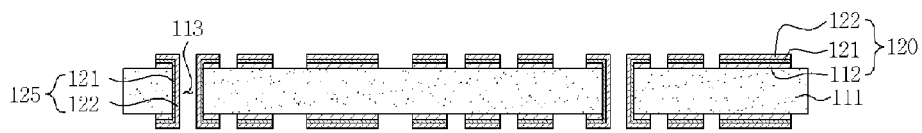

Referring to FIG. 4, the inner layer circuit layer 120 may be formed. The inner layer circuit layer 120 may be formed by patterning the first copper clad layer 112, the first seed layer 121, and the first plating layer 122. As described above, the through hole 125 penetrating through the internal insulating layer 111 may be formed simultaneously with forming the inner layer circuit layer 120.

Figure 5:
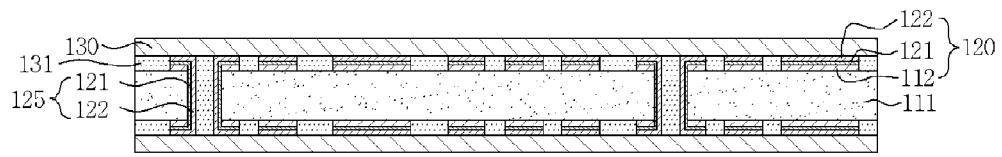

Referring to FIG. 5, the coverlay 130 may be formed on the inner layer circuit layer 120. The coverlay 130 may be formed to protect the inner layer circuit layer 120 from the outside. The coverlay 130 may be attached on the inner layer circuit layer 120 by the adhesive 131. The coverlay 130 may be formed of the polyimide film. Alternatively, the coverlay 130 may be formed of the photo imageable coverlay (PIC).

Figure 6:
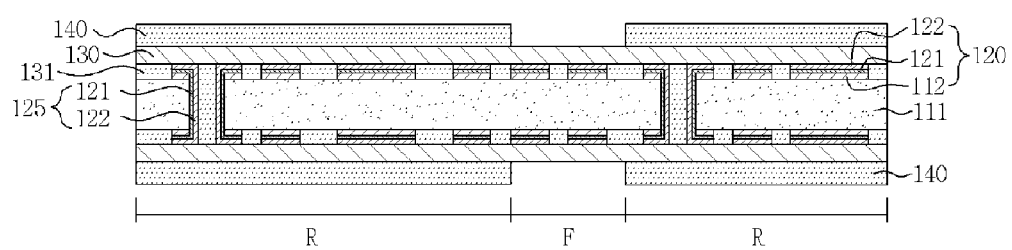

Referring to FIG. 6, the first insulating layer 140 may be formed on the coverlay 130. The first insulating layer 140 may be formed in the rigid region R. The first insulating layer 140 may be the B-stage prepreg having flowability. The first insulating layer 140 may be formed on the coverlay 130 by being punched and patterned in advance.

Figure 7:
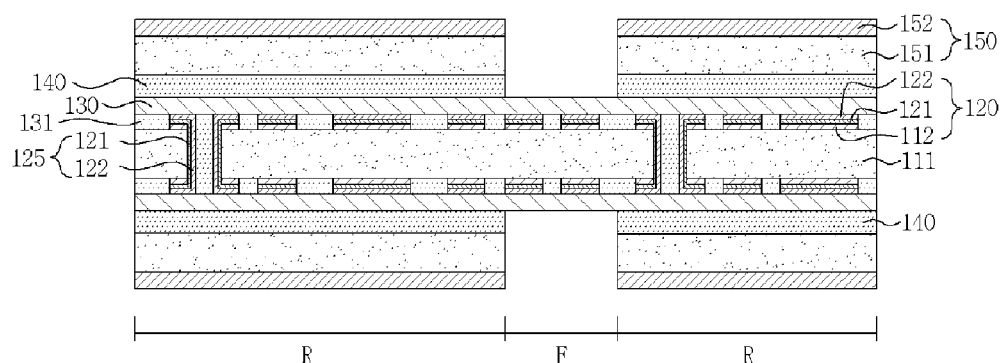

Referring to FIG. 7, the reinforcement layer 150 may be formed on the first insulating layer 140. The reinforcement layer 150 may be made of a C-stage, high-rigidity material having a high glass transition temperature Tg. For example, the reinforcement layer 150 may have a glass transition temperature Tg of 180° C. or more. The reinforcement layer 150 may include the second insulating layer 151 and the second copper clad layer 152 which is formed on one surface of the second insulating layer 151. Here, the second insulating layer 151 may be a C stage prepreg. For example, the reinforcement layer 150 may be a single-sided copper clad laminated (CCL) plate. The reinforcement layer 150 may be laminated on the first insulating layer 140 by being punched and patterned in advance.

As described above, the reinforcement layer 150 is formed on the first insulating layer 140 and is then heated and pressed, thereby hardening the first insulating layer 140.

According to the embodiment of the present invention, the use of the first insulating layer 140 having high flowability may be reduced by including the C-stage reinforcement layer 150. That is, when the first insulating layer 140 thinly formed and having high flowability is heated and pressed, the first insulating layer 140 which flows into the flexible region F and is hardened may be reduced. As described above, it is possible to improve the flatness of the substrate by reducing the flowing of the first insulating layer 140 into the flexible region F. Further, it is possible to improve the rigidity and flatness of the substrate by the C-stage second insulating layer 151 and the second copper clad layer 152 on the reinforcement layer 150.

Figure 8:
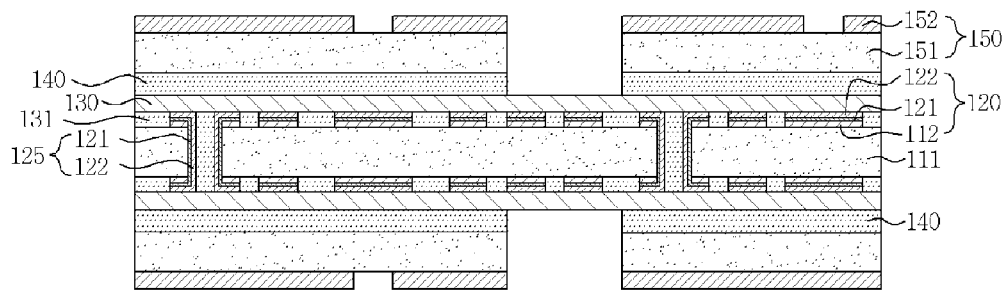

Referring to FIG. 8, the second copper clad layer 152 may be patterned. The second copper clad layer 152 may be patterned so that a region in which the first via (not illustrated) is formed later is opened. In this case, the second copper clad layer 152 may be patterned by performing an etching process using an etching resist (not illustrated) in which the region in which the first via (not illustrated) is formed is opened. However, a method of patterning the second clad layer 152 is not limited thereto and any of the patterning methods known to those skilled in the art may be used.

Figure 9:
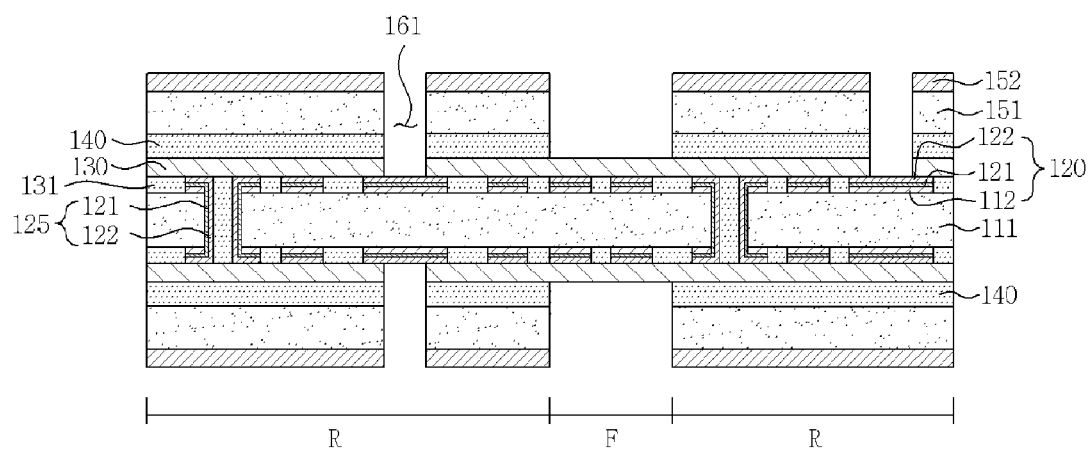

Referring to FIG. 9, a first via hole 161 may be formed. The first via hole 161 may be formed to penetrate through the first insulating layer 140, the reinforcement layer 150, and the coverlay 130 through the region in which the second copper clad layer 152 is patterned.

Figure 10:
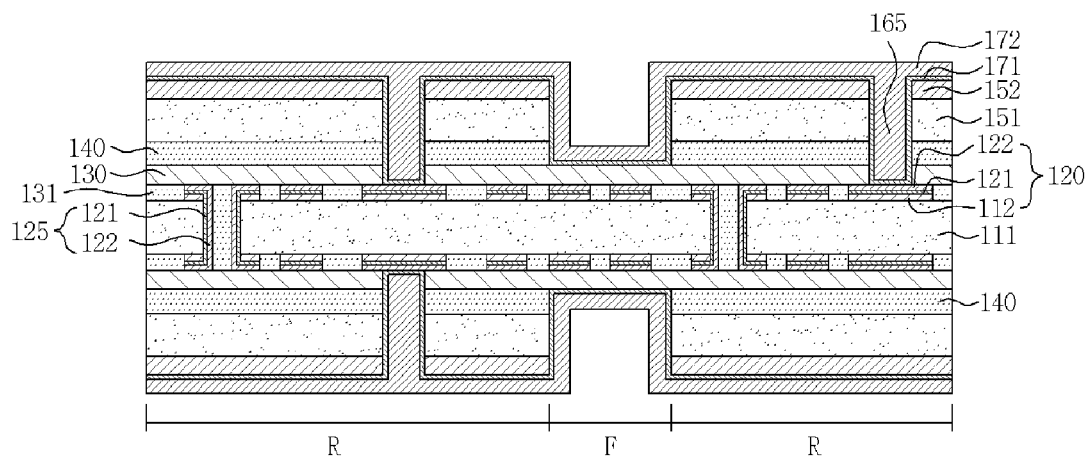

Referring to FIG. 10, the second seed layer 171 may be formed in the first via hole 161, the second copper clad layer 152, and the flexible region F. The second seed layer 171 may be formed by the electroless plating method. The second plating layer 172 may be formed on the second seed layer 171. The second plating layer 172 may be formed by the electroplating method. In this case, the first via hole 161 is buried by the second seed layer 171 and the second plating layer 172 to form the first via 165.

Figure 11:
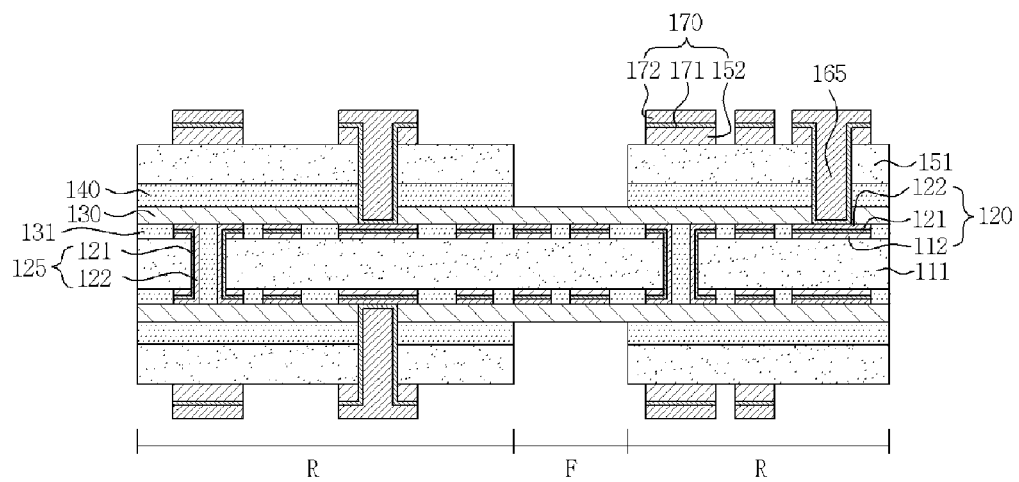

Referring to FIG. 11, the outer layer circuit layer 170 may be formed. The outer layer circuit layer 170 may be formed by patterning the second copper clad layer 152, the second seed layer 171, and the second plating layer 172.

Figure 12:
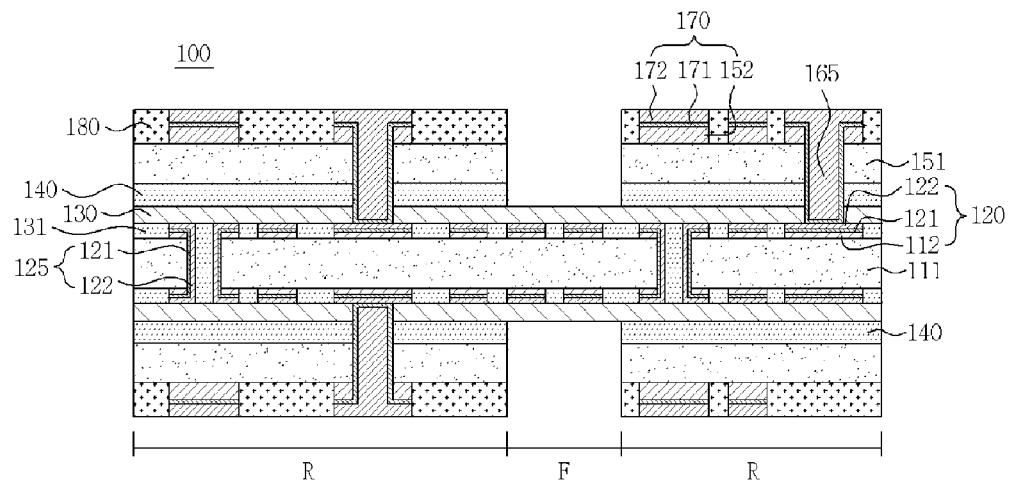

Referring to FIG. 12, the solder resist layer 180 may be formed. The solder resist layer 180 may be formed to bury the outer layer circuit layer 170.

According to the rigid flexible printed circuit board and the method of manufacturing the same according to the embodiment of the present invention, the rigidity and flatness may be improved by forming the C-stage second insulating layer 151 on the B-stage first insulating layer 140.

Figure 13:
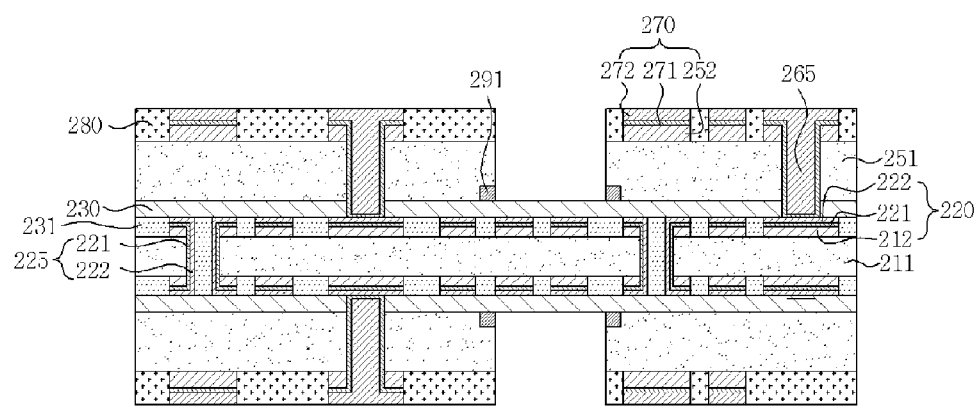
FIG. 13 is an exemplified diagram illustrating a rigid flexible printed circuit board according to another embodiment of the present invention.

FIG. 13 is an exemplified diagram illustrating a rigid flexible printed circuit board according to another embodiment of the present invention.

Referring to FIG. 13, a rigid flexible printed circuit board 200 may include an internal insulating layer 211, an inner layer circuit layer 220, a coverlay 230, a first insulating layer 251, an outer layer circuit layer 270, and a solder resist layer 280.

The internal insulating layer 211 may be made of flexible insulating materials which are known to those skilled in the art. For example, the internal insulating layer 211 may be made of polyimide. An inside of the internal insulating layer 211 may be provided with a through via 225 which penetrates through the internal insulating layer 211. The internal insulating layer 211 may include a rigid region R and a flexible region F.

The inner layer circuit layer 220 may include a first copper clad layer 212, a first seed layer 221, and a first plating layer 222 of the internal insulating layer 211. The inner layer circuit layer 220 may be made of conductive materials. The inner layer circuit layer 220 may be formed by applying a method of forming a circuit pattern known to those skilled in the art.

The coverlay 230 may be formed on the inner layer circuit layer 220. The coverlay 230 may be formed to protect the inner layer circuit layer 220 from the outside. To form the coverlay 230 on the inner layer circuit layer 220, an adhesive 231 may be applied among the internal insulating layer 211, the inner layer circuit layer 220, and the coverlay 230. The coverlay 230 may be formed of the polyimide film. Alternatively, the coverlay 230 may be formed of the photo imageable coverlay (PIC).

A stop pattern 291 may be formed on the coverlay 230. When the flexible region F suffers from the etching process, the stop pattern 291 may be formed so as to protect components on a lower portion of the stop pattern 291 from the etching process. The stop pattern 291 may be made of conductive metals such as copper.

The first insulating layer 251 may be formed on the coverlay 230. Further, the first insulating layer 251 may be formed to bury the stop pattern 291. The first insulating layer 251 may be formed in the rigid region R. After the first insulating layer 251 may be formed by being laminated with the B-stage prepreg having flowability and then suffering from the hardening process. Further, the first insulating layer 251 may have the high rigidity and high glass transition temperature. For example, the glass transition temperature of the first insulating layer 251 may be 180° C. or more. Due to the high glass transition temperature, it is possible to prevent the hardened state of the first insulating layer 251 from changing even at the time of the following high temperature process. That is, it is possible to prevent a step from occurring in the substrate due to the flowing of the first insulating layer 251 which is caused by the high temperature process as in the prior art.

Although not illustrated in the embodiment of the present invention, an adhesive layer (not illustrated) may be applied on the coverlay 230 to improve an adhesion between the coverlay 230 and the first insulating layer 251.

The outer layer circuit layer 270 may be formed on the first insulating layer 251. The outer layer circuit layer 270 may be electrically connected to a first via 265 which penetrates through the first insulating layer 251. The first via 265 may electrically connect the inner layer circuit layer 220 to the outer layer circuit layer 270. The outer layer circuit layer 270 may include a second copper clad layer 252, a second seed layer 271, and a second plating layer 272. The outer layer circuit layer 270 may be made of conductive materials. The outer layer circuit layer 270 may be formed by applying the method of forming a circuit pattern which is known to those skilled in the art.

The solder resist layer 280 may be formed to bury the outer layer circuit layer 270.

FIGS. 14 through 24 are exemplified diagrams showing a method for manufacturing a rigid flexible printed circuit board according to another embodiment of the present invention.

Figure 14:
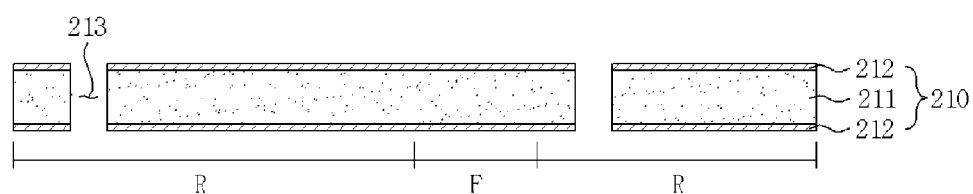
FIGS. 14 through 24 are exemplified diagrams showing a method for manufacturing a rigid flexible printed circuit board according to another embodiment of the present invention.

Referring to FIG. 14, a base substrate 210 on which a through hole 213 is formed may be provided. The base substrate 210 may be the flexible copper clad laminated (FCCL) plate which is formed of the internal insulating layer 211 and the first copper clad layer 212. The internal insulating layer 211 may be made of polyimide. The through hole 213 may be formed on the base substrate 210 by using CNC drill.

Figure 15:
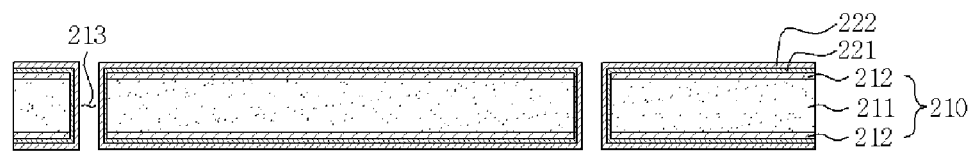

Referring to FIG. 15, the first seed layer 221 and the first plating layer 222 may be formed on an inner wall of the through hole 213 and on the first copper clad layer 212. The first seed layer 221 may be formed by the electroless plating method. The first plating layer 222 may be formed by the electroplating method.

Figure 16:
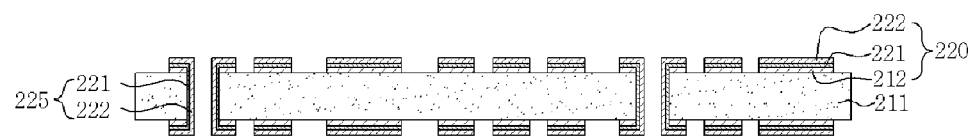

Referring to FIG. 16, the inner layer circuit layer 220 may be formed. The inner layer circuit layer 220 may be formed by patterning the first copper clad layer 212, the first seed layer 221, and the first plating layer 222. As described above, the through hole 225 penetrating through the internal insulating layer 211 may be formed simultaneously with forming the inner layer circuit layer 220.

Figure 17:
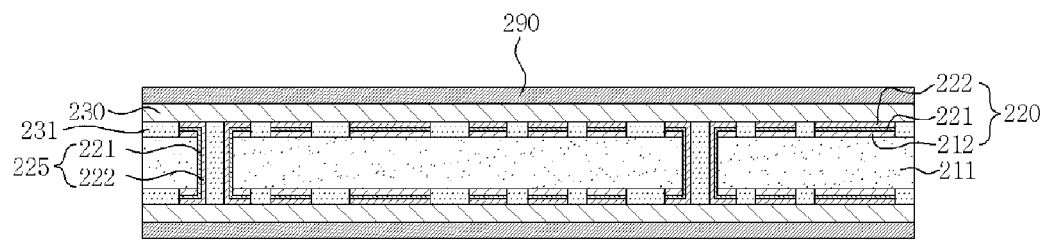

Referring to FIG. 17, the coverlay 230 may be formed on the inner layer circuit layer 220. The coverlay 230 according to the embodiment of the present invention may have a third copper clad layer 290 formed on an upper portion thereof. The coverlay 230 may be attached on the inner layer circuit layer 220 by the adhesive 231. The coverlay 230 may be formed of the polyimide film. Alternatively, the coverlay 230 may be formed of the photo imageable coverlay (PIC). In the forming of the coverlay 230 according to the embodiment of the present invention, attaching the coverlay 230 formed with the third copper clad layer 290 on the inner layer circuit layer 220 is described; however, the embodiment of the present invention is not limited thereto. That is, the forming of the coverlay 230 may be performed in a sequence of attaching the coverlay 230 on the inner layer circuit layer 220 and then forming the third copper clad layer 290 on the coverlay 230. Further, although not illustrated, an adhesive layer may be applied on the coverlay 230. In this case, the adhesive layer applied on the coverlay 230 may be formed to improve the adhesion with the first insulating layer 251 (FIG. 19) to be formed later.

Figure 18:
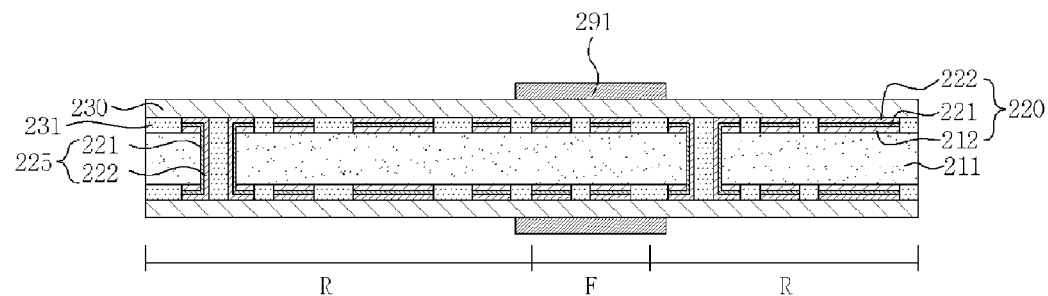

Referring to FIG. 18, the stop pattern 291 may be formed. Herein, the stop pattern 291 is a component part to prevent the progress of etching at the time of performing a laser etching process to be performed later. The stop pattern 291 may be formed by patterning the third copper clad layer 290 (FIG. 17). According to the embodiment of the present invention, the stop pattern 291 may be formed in the flexible region F.

Figure 19:
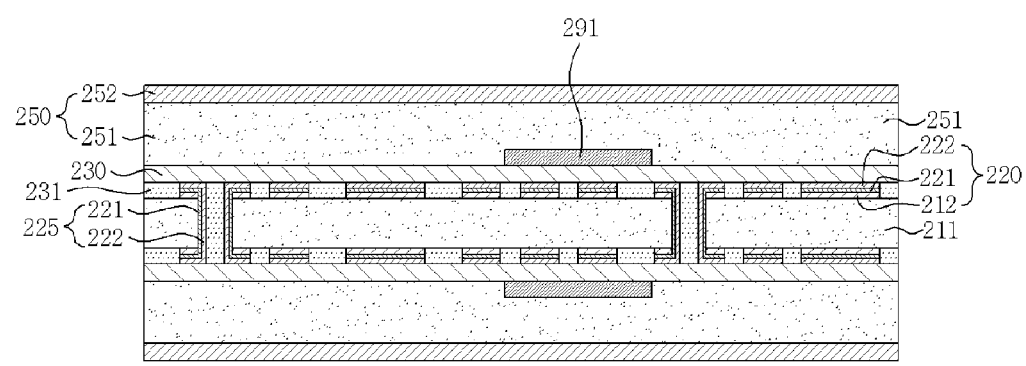

Referring to FIG. 19, the reinforcement layer 250 may be formed on the coverlay 230 and the stop pattern 291. The reinforcement layer 250 may include the first insulating layer 251 and the second copper clad layer 252 which is formed on one surface of the first insulating layer 251. The first insulating layer 251 may be made of a material having a high glass transition temperature Tg. For example, the first insulating layer 251 may be the prepreg having a high glass transition temperature of 180° C. or more. When the reinforcement layer 250 is formed on the coverlay 230, the first insulating layer 251 may be in the B stage. The reinforcement layer 250 having the B-stage first insulating layer 251 is formed and is then heated and pressed, thereby hardening the first insulating layer 251. The reinforcement layer 250 undergoing the hardening process is in the C stage and may have the high rigidity and high glass transition temperature of 180° C. or more. Due to the high glass transition temperature, it is possible to prevent the hardened state of the first insulating layer 251 from changing even at the time of the following high temperature process. That is, it is possible to prevent a step from occurring in the substrate due to the flowing of the first insulating layer 251 which is caused by the high temperature process as in the prior art. Further, the rigidity and flatness of the substrate may be more improved by the second copper clad layer 252.

Figure 20:
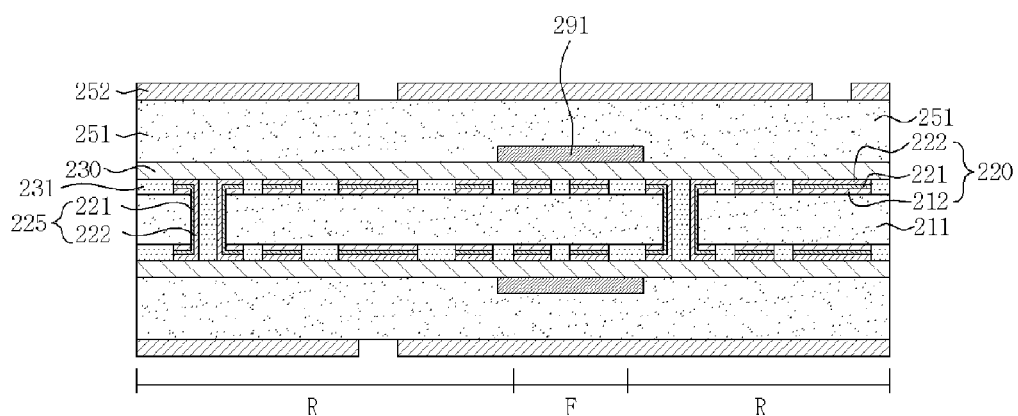

Referring to FIG. 20, the second copper clad layer 252 may be patterned. The second copper clad layer 252 may be patterned so that a region in which the first via (not illustrated) is formed later is opened. Further, the second copper clad layer 252 may be patterned so that the flexible region F is opened.

Figure 21:
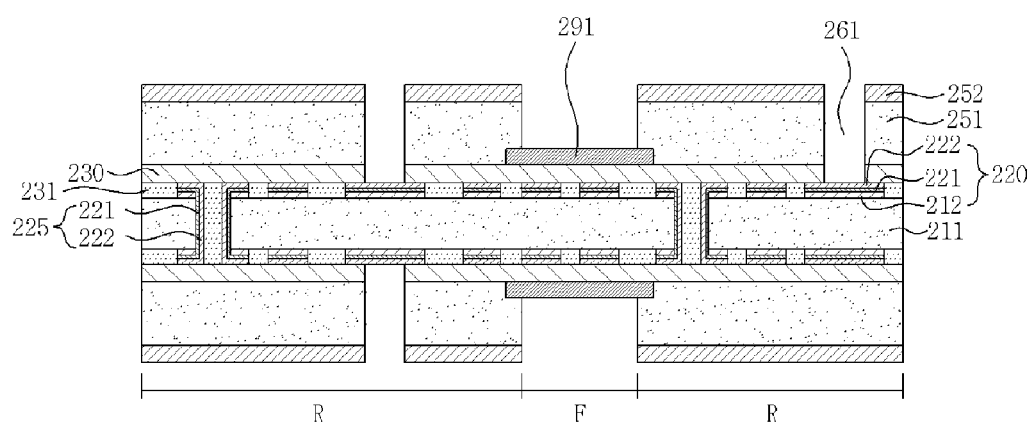

Referring to FIG. 21, a first via hole 261 may be formed. The first via hole 261 may be formed to penetrate through the first insulating layer 251 and the coverlay 230 through the region in which the second copper clad layer 252 is patterned. The first via hole 261 may be formed by laser machining.

Figure 22:
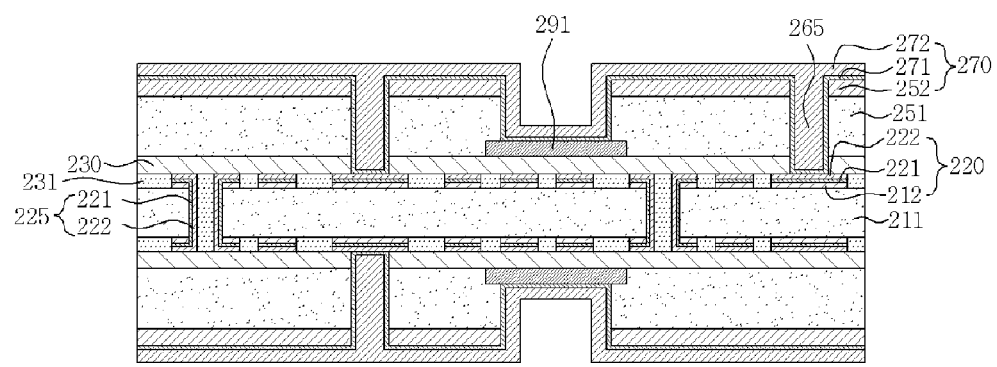

Referring to FIG. 22, the second seed layer 271 and the second plating layer 272 may be formed in the first via hole 261, the second copper clad layer 252, and the stop pattern 291. In this case, the first via hole 261 is buried by the second seed layer 271 and the second plating layer 272 to form the first via 265.

Figure 23:
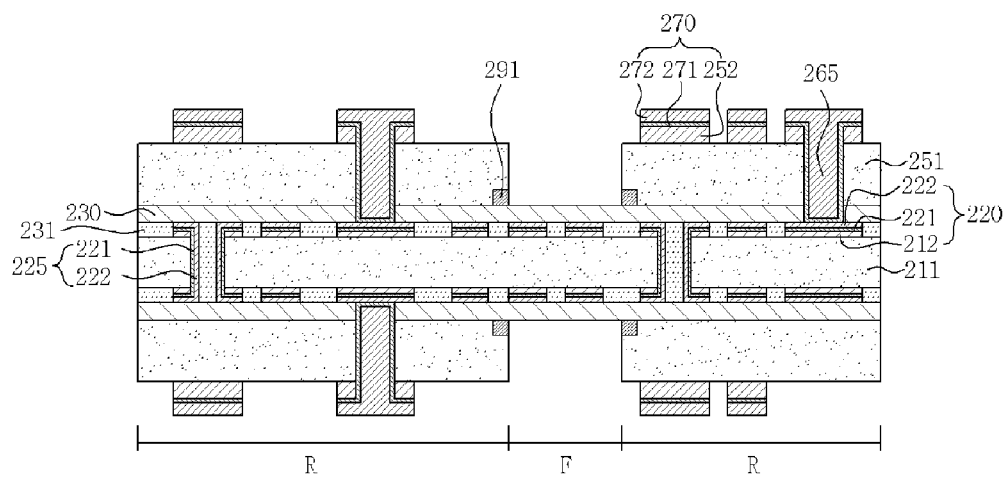

Referring to FIG. 23, the outer layer circuit layer 270 may be formed. The outer layer circuit layer 270 may be formed by patterning the second copper clad layer 252, the second seed layer 271, and the second plating layer 272. The outer layer circuit layer 270 may be patterned by performing the etching using technologies known to those skilled in the art. In this case, the second plating layer 272, the second seed layer 271, and the stop pattern 291 of the flexible region F may be removed. The etching of the flexible region F may be performed by the laser machining. When the etching is performed by the laser machining, the coverlay 230 and the inner layer circuit layer 220 of the flexible region F may be protected without being removed, due to the stop pattern 291.

Figure 24:
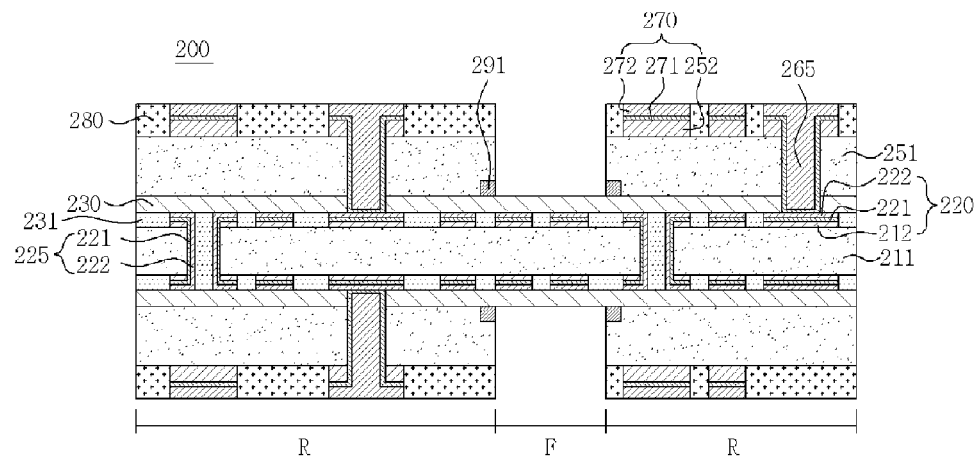

Referring to FIG. 24, the solder resist layer 280 may be formed. The solder resist layer 280 may be formed to bury the outer layer circuit layer 270.

The rigid flexible printed circuit board and the method for manufacturing the same according to the embodiment of the present invention applies the reinforcement layer instead of the insulating layer according to the prior art, thereby improving the rigidity and flatness of the substrate.

Figure 25:
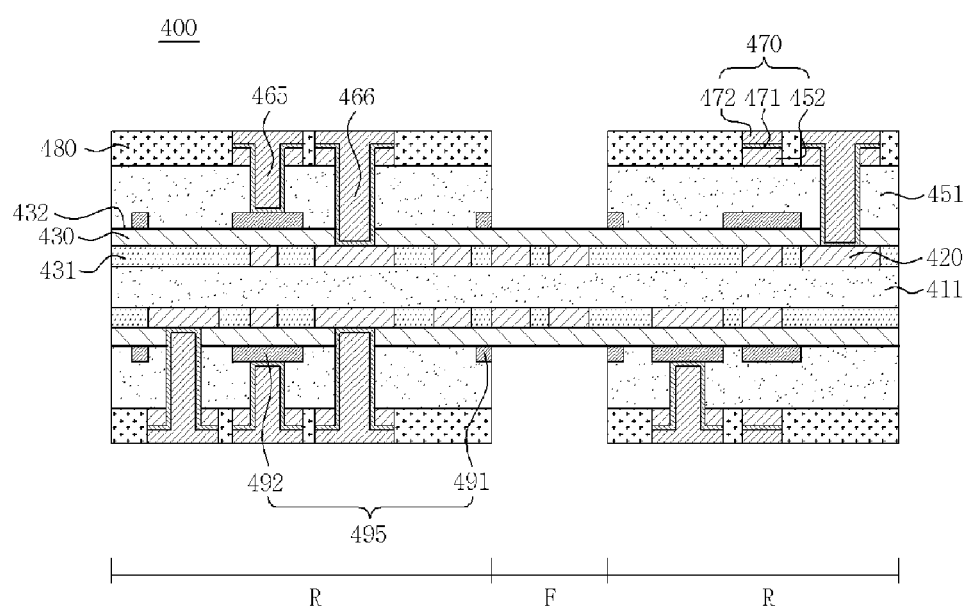
FIG. 25 is an exemplified diagram illustrating a rigid flexible printed circuit board according to another embodiment of the present invention.

FIG. 25 is an exemplified diagram illustrating a rigid flexible printed circuit board according to another embodiment of the present invention.

A rigid flexible printed circuit board 400 according to an embodiment of the present invention may be formed to have a six layer structure.

Referring to FIG. 25, the rigid flexible printed circuit board 400 may include an internal insulating layer 411, an inner layer circuit layer 420, a coverlay 430, a first circuit layer 495, a first insulating layer 451, an outer layer circuit layer 470, and a solder resist layer 480.

The internal insulating layer 411 may be made of flexible insulating materials known to those skilled in the art. For example, the internal insulting layer 411 may be made of polyimide. The internal insulating layer 411 may include the rigid region R and the flexible region F.

The inner layer circuit layer 420 may be formed on the internal insulating layer 411. The inner layer circuit layer 420 may be made of conductive materials. The inner layer circuit layer 420 may be formed by applying a method of forming a circuit pattern known to those skilled in the art.

The coverlay 430 may be formed on the inner layer circuit layer 420. The coverlay 430 may be formed to protect the inner layer circuit layer 420 from the outside. To form the coverlay 430 on the inner layer circuit layer 420, an adhesive 431 may be applied among the internal insulating layer 411, the inner layer circuit layer 420, and the coverlay 430. The coverlay 430 may be formed of the polyimide film. Alternatively, the coverlay 430 may be formed of the photo imageable coverlay (PIC).

An adhesive layer 432 may be formed on the coverlay 430. The adhesive layer 432 may be formed to improve adhesion between the coverlay 430 and the first insulating layer 451.

The first circuit layer 495 may be formed on the coverlay 430. The first circuit layer 495 may include a first circuit pattern 492 and a stop pattern 491. When the flexible region F suffers from the etching process, the stop pattern 491 may be formed so as to protect components on a lower portion of the stop pattern 491 from the etching process. The stop pattern 491 may be made of conductive metals such as copper.

The first insulating layer 451 may be formed on the adhesive layer 432. Further, the first insulating layer 451 may be formed to bury the first circuit layer 495. The first insulating layer 451 may be formed in the rigid region R. After the first insulating layer 451 may be formed by being laminated with the B-stage prepreg having flowability and then suffering from the hardening process. The B-stage first insulating layer 451 may be hardened by being subjected to a pressing and heating process and then filling a space between a first circuit pattern 492 and a stop pattern 491. Further, the first insulating layer 451 may have the high rigidity and high glass transition temperature. For example, the glass transition temperature of the first insulating layer 451 may be 180° C. or more. The first insulating layer 451 has a high glass transition temperature to able to prevent the hardened state of the first insulating layer 451 from changing even at the time of the following high temperature process. That is, it is possible to prevent a step from occurring in the substrate due to the flowing of the first insulating layer 451 which is caused by the high temperature process as in the prior art. Further, the space between the inner layer circuit layers 420 is buried and then the inner layer circuit layers are hardened, such that it is possible to prevent voids from occurring between the inner layer circuit layers 420.

The outer layer circuit layer 470 may be formed on the first insulating layer 451. The outer layer circuit layer 470 may include a second copper clad layer 452, a second seed layer 471, and a second plating layer 472. The outer layer circuit layer 470 may be electrically connected to at least one of a first via 465 and a second via 466. The outer layer circuit layer 470 may be formed by applying the method of forming a circuit pattern which is known to those skilled in the art.

According to the embodiment of the present invention, the first via 466 and the second via 465 may be formed. The first via 466 may be formed to penetrate through the first insulating layer 451 and the coverlay 430. Further, the second via 465 may be formed to penetrate through the first insulating layer 451. The so formed first via 466 may electrically connect the outer layer circuit layer 470 to the inner layer circuit layer 420. Further, the second via 465 may electrically connect the outer layer circuit layer 470 to the first circuit layer 495.

The solder resist layer 480 may be formed on the outer layer circuit layer 470. The solder resist layer 480 may be formed to bury the outer layer circuit layer 470.

FIGS. 26 through 34 are exemplified diagrams showing a method for manufacturing a rigid flexible printed circuit board according to another embodiment of the present invention.

Figure 26:
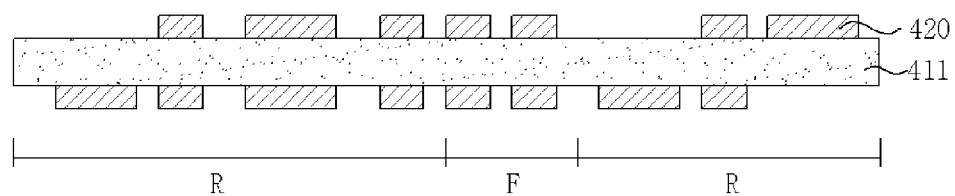
FIGS. 26 through 34 are exemplified diagrams showing a method for manufacturing a rigid flexible printed circuit board according to another embodiment of the present invention.

Referring to FIG. 26, the internal insulating layer 411 on which the inner layer circuit layer 420 is formed may be provided. For example, the internal insulating layer 411 on which the inner layer circuit layer 420 is formed may be formed of the flexible copper clad laminated (FCCL) plate. That is, the inner layer circuit layer 420 may be formed by patterning the copper clad of the flexible copper clad laminated plate.

The inner layer circuit layer 420 may be formed by applying a method of forming a circuit pattern which is known to those skilled in the art. The inner layer circuit layer 420 may include an internal circuit pattern and an internal pad. Herein, the internal pad may be configured to be electrically connected to the via.

The internal insulating layer 411 may include the rigid region R and the flexible region F.

Figure 27:
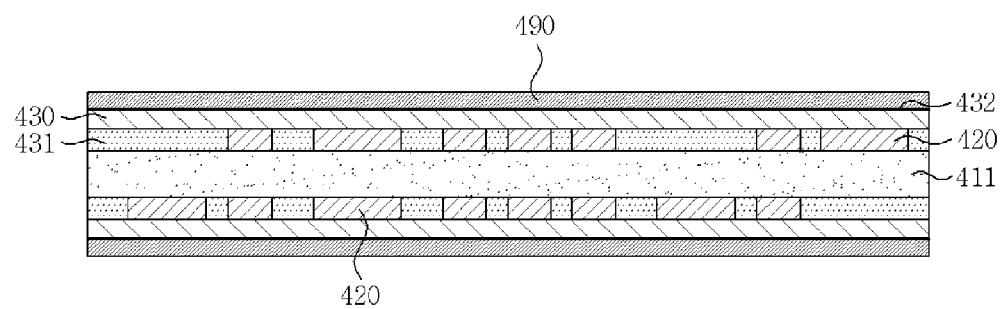

Referring to FIG. 27, the coverlay 430 may be formed on the inner layer circuit layer 420. The coverlay 430 according to the embodiment of the present invention may have a third copper clad layer 490 formed on an upper portion thereof. Here, an adhesive layer 432 may be formed between the coverlay 430 and the third copper clad layer 490. The coverlay 430 may be attached on the inner layer circuit layer 420 by the adhesive 431. The coverlay 430 may be formed of the polyimide film. Alternatively, the coverlay 430 may be formed of the photo imageable coverlay (PIC). In the forming of the coverlay 430 according to the embodiment of the present invention, attaching the coverlay 430 formed with the third copper clad layer 490 on the inner layer circuit layer 420 is described; however, the embodiment of the present invention is not limited thereto. That is, the forming of the coverlay 430 may be performed in a sequence of attaching the coverlay 430 on the inner layer circuit layer 420 and then forming the adhesive layer 432 and the third copper clad layer 490 on the coverlay 430. The adhesive layer 432 is formed to improve the adhesion between the coverlay 430 and the first insulating layer 451 to be formed later.

Figure 28:
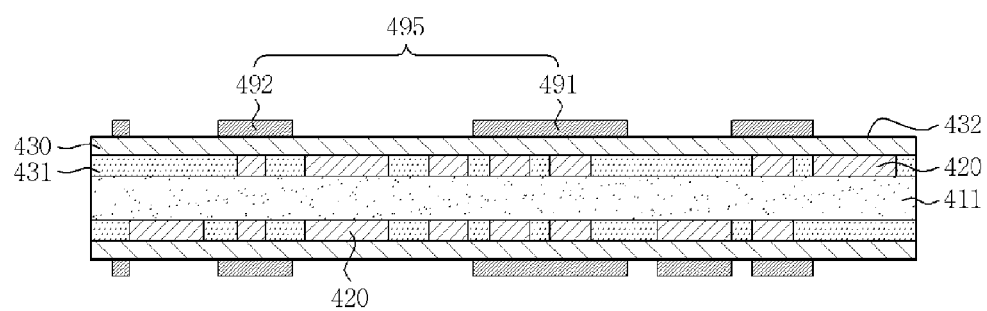

Referring to FIG. 28, the first circuit layer 495 may be formed. The first circuit layer 495 may be formed on the adhesive layer 432. The first circuit layer 495 may be formed by patterning the third copper clad layer 490. The first circuit layer 495 may include the first circuit pattern 492 and the stop pattern 491. The stop pattern 491 is a component part to prevent the progress of etching at the time of performing the etching process to be performed later. According to the embodiment of the present invention, the stop pattern 491 may be formed in the flexible region F.

Figure 29:
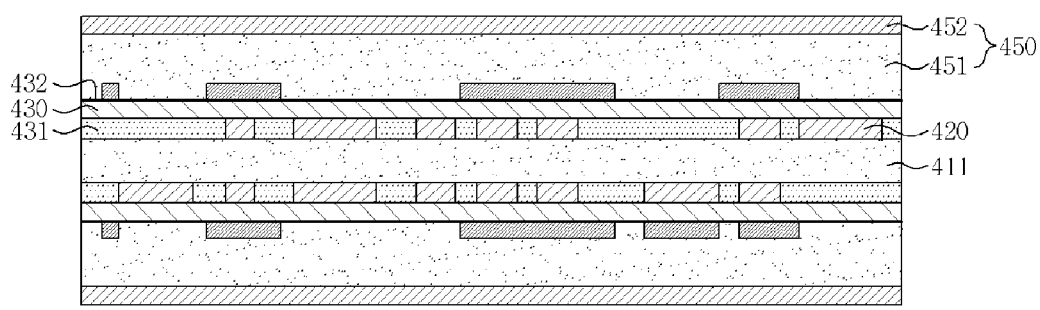

Referring to FIG. 29, the reinforcement layer 450 may be formed on the coverlay 430 and the first circuit layer 495. The reinforcement layer 450 may include the first insulating layer 451 and the second copper clad layer 452 which is formed on one surface of the first insulating layer 451. The first insulating layer 451 may be made of a material having a high glass transition temperature Tg. For example, the first insulating layer 451 may be the prepreg having the high glass transition temperature of 180° C. or more. When the reinforcement layer 450 is formed on the coverlay 430, the first insulating layer 451 may be in the B stage. The reinforcement layer 450 having the B-stage first insulating layer 451 is formed and is then heated and pressed, thereby hardening the first insulating layer 451. The first insulating layer 451 may be hardened by suffering from the pressing and heating process and then filling a space between a first circuit pattern 492 and a stop pattern 491. The reinforcement layer 450 suffering from the hardening process is in the C stage and may have the high rigidity and high glass transition temperature of 180° C. or more. Due to the high glass transition temperature, it is possible to prevent the hardened state of the first insulating layer 451 from changing even at the time of the following high temperature process. That is, it is possible to prevent a step from occurring in the substrate due to the flowing of the first insulating layer 451 which is caused by the high temperature process as in the prior art. Further, the rigidity and flatness of the substrate may be more improved by the second copper clad layer 452. Further, the space between the inner layer circuit layers 420 is buried and then the inner layer circuit layers are hardened, such that it is possible to prevent voids from occurring between the inner layer circuit layers 420.

Figure 30:
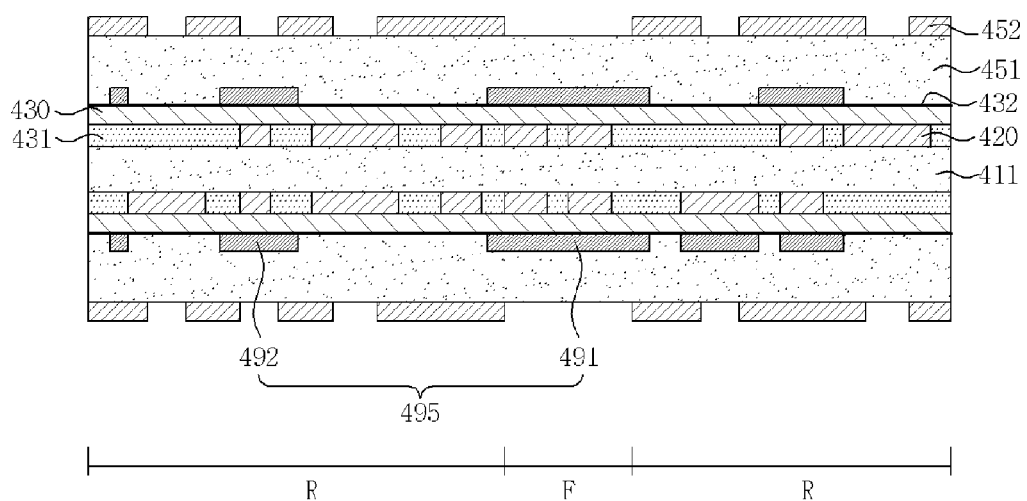

Referring to FIG. 30, the second copper clad layer 452 may be patterned. The second copper clad layer 452 may be patterned so that the region in which the first via 466 (FIG. 32) and the second via 465 (FIG. 32) are formed is opened. Further, the second copper clad layer 452 may be patterned so that the flexible region F is opened.

Figure 31:
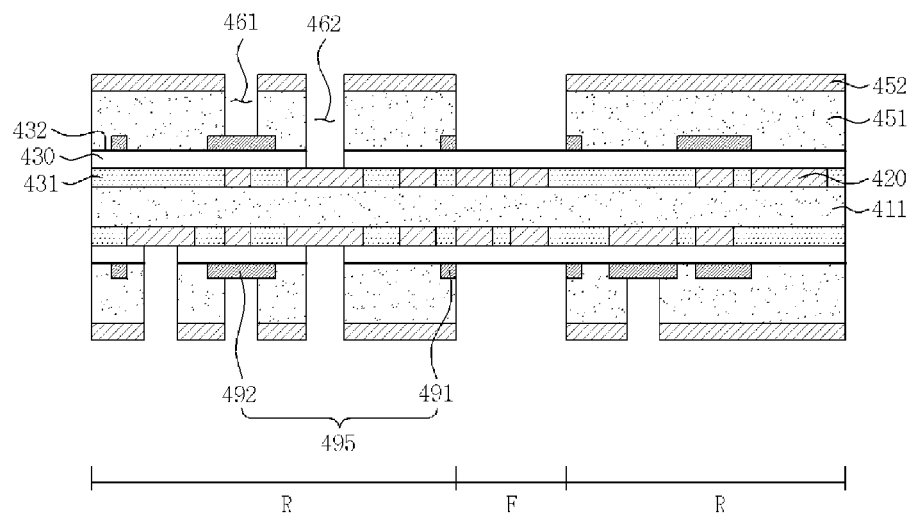

Referring to FIG. 31, a first via hole 462 and a second via hole 461 may be formed. The first via hole 462 may be formed to penetrate through the first insulating layer 451 and the coverlay 430. The second via hole 461 may be formed to penetrate through the first insulating layer 451 through the region in which the second copper clad layer 452 is patterned. The first via hole 462 and the second via hole 461 may be formed by the laser machining. Further, the first insulating layer 451 of the flexible region F may be removed simultaneously with forming the first via hole 462 and the second via hole 461. In this case, since the first insulating layer 451 is removed by the laser machining, the flexible region F may be protected without removing the coverlay 430 and the inner layer circuit layer 420, due to the stop pattern 491.

Figure 32:
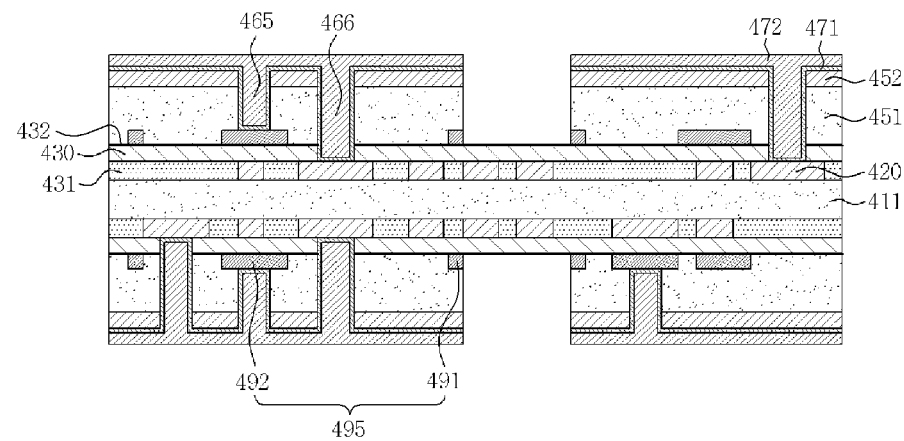

Referring to FIG. 32, the second seed layer 471 and the second plating layer 472 may be formed in the first via hole 462, the second via hole 461, the second copper clad layer 452, and the stop pattern 491. In this case, the insides of the first via hole 462 and the second via hole 461 are buried with the second plating layer 472, such that the first via 466 and the second via 465 may be formed. According to the embodiment of the present invention, the first via 466 may be formed to penetrate through the first insulating layer 451 and the coverlay 430. Further, the second via 465 may be formed to penetrate through the first insulating layer 451.

Figure 33:
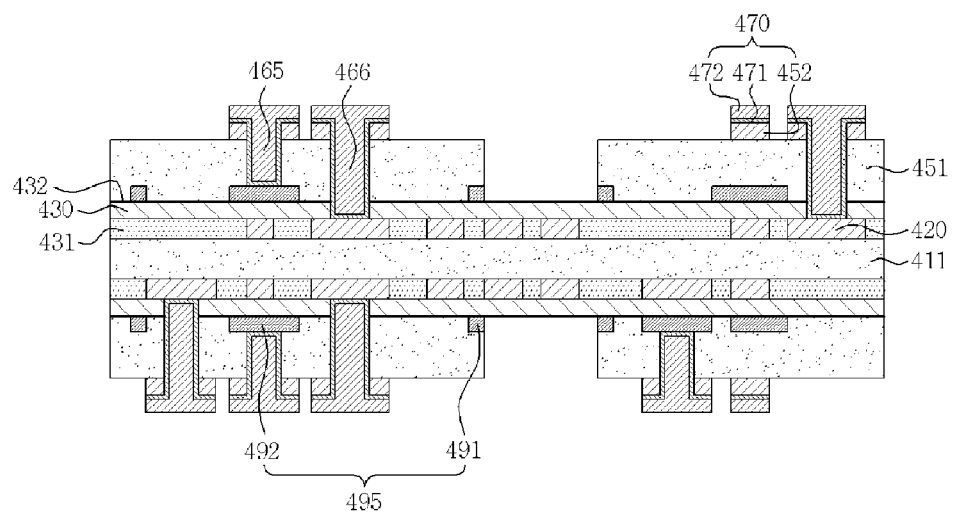

Referring to FIG. 33, the outer layer circuit layer 470 may be formed. The outer layer circuit layer 470 may be formed by patterning the second copper clad layer 452, the second seed layer 471, and the second plating layer 472. The outer layer circuit layer 470 may be patterned by performing the etching using technologies known to those skilled in the art. In this case, the second plating layer 472, the second seed layer 471, and the stop pattern 491 of the flexible region F may be removed. The etching of the flexible region F may be performed by the laser machining. When the etching is performed by the laser machining, the coverlay 430 and the inner layer circuit layer 420 of the flexible region F may be protected without being removed, due to the stop pattern 491.

According to the embodiment of the present invention, the first via 466 may electrically connect the outer layer circuit layer 470 to the inner layer circuit layer 420. Further, the second via 465 may electrically connect the outer layer circuit layer 470 to the first circuit layer 495.

Figure 34:
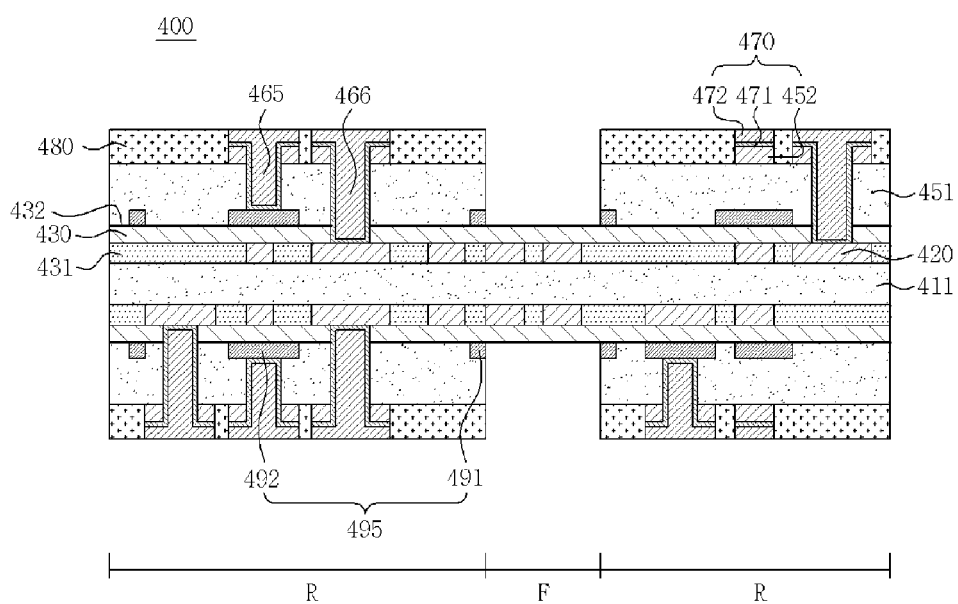

Referring to FIG. 34, the solder resist layer 480 may be formed. The solder resist layer 480 may be formed to bury the outer layer circuit layer 470.

The rigid flexible printed circuit board and the method for manufacturing the same according to the embodiment of the present invention applies the reinforcement layer instead of the insulating layer according to the prior art, thereby improving the rigidity and flatness of the substrate. Further, the thickness of the substrate may be reduced by forming the single circuit layer using the process of forming the stop pattern.

According to the rigid flexible printed circuit board and the method of manufacturing the same according to the embodiments of the present invention, it is possible to improve the flatness.

According to the rigid flexible printed circuit board and the method of manufacturing the same according to the embodiments of the present invention, it is possible to prevent the void from occurring.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention as defined in the claims and their equivalents.

What is claimed is:

1. A rigid flexible printed circuit board having a rigid region and a flexible region, comprising:
    a base substrate including a portion in the rigid region and a portion in the flexible region, and including an internal insulating layer and an inner layer circuit layer formed on the internal insulating layer;
    a coverlay formed on the base substrate;
    a first insulating layer formed on the coverlay and formed in the rigid region;
    a second insulating layer formed on the first insulating layer;
    an outer layer circuit layer formed on the second insulating layer; and
    a via electrically connecting the inner layer circuit layer to the outer layer circuit layer by penetrating through the first insulating layer, the second insulating layer, and the coverlay,
        wherein a glass transition temperature of the second insulating layer is 180° C. or more.

2. The rigid flexible printed circuit board as set forth in claim 1, wherein the first insulating layer is laminated in a B stage and then hardened.

3. The rigid flexible printed circuit board as set forth in claim 1, wherein the second insulating layer is a C-stage insulating layer.

4. The rigid flexible printed circuit board as set forth in claim 1, further comprising:
    a solder resist layer formed on the second insulating layer to bury the outer layer circuit layer.

5. The rigid flexible printed circuit board as set forth in claim 1, wherein the coverlay is attached to the base substrate by an adhesive which is formed on one surface of the coverlay.

6. A rigid flexible printed circuit board having a rigid region and a flexible region, comprising:
    a base substrate including a portion in the rigid region and a portion in the flexible region, and including an internal insulating layer and an inner layer circuit layer formed on the internal insulating layer;
    a coverlay formed on the base substrate;
    a stop pattern formed on the coverlay of the rigid region and having a side surface exposed in the flexible region;
    a first insulating layer formed on the coverlay and formed in the rigid region;
    an outer layer circuit layer formed on the first insulating layer; and
    a first via electrically connecting the inner layer circuit layer to the outer layer circuit layer by penetrating through the first insulating layer and the coverlay,
        wherein a glass transition temperature of the first insulating layer is 180° C. or more.

7. The rigid flexible printed circuit board as set forth in claim 6, further comprising:
    a solder resist layer formed on the first insulating layer to bury the outer layer circuit layer.

8. The rigid flexible printed circuit board as set forth in claim 6, wherein the coverlay is attached to the base substrate by an adhesive which is formed on one surface of the coverlay.

9. The rigid flexible printed circuit board as set forth in claim 6, further comprising:
    an adhesive layer formed between the coverlay and the first insulating layer.

10. The rigid flexible printed circuit board as set forth in claim 6, further comprising:
    a first circuit layer formed on the coverlay to be buried in the first insulating layer.

11. The rigid flexible printed circuit board as set forth in claim 10, further comprising:
    a second via electrically connecting the first circuit layer to the outer layer circuit layer by penetrating through the first insulating layer.

12. The rigid flexible printed circuit board as set forth in claim 10, wherein the stop pattern is a portion of a circuit layer formed on the coverlay.

13. A rigid flexible printed circuit board having a rigid region and a flexible region, comprising:
    a base substrate including a portion in the rigid region and a portion in the flexible region, and including an internal insulating layer and an inner layer circuit layer formed on the internal insulating layer;
    a coverlay formed on the base substrate;
    an insulating layer formed on the coverlay and formed in the rigid region, the insulating layer having a boundary portion, at a boundary of the rigid region adjacent to the flexible region, that is on an intermediate member interposed between the boundary portion and the coverlay;
    an outer layer circuit layer formed on the insulating layer; and a via electrically connecting the inner layer circuit layer to the outer layer circuit layer by penetrating through the insulating layer and the coverlay, wherein a glass transition temperature of the insulating layer is 180° C. or more.

14. The rigid flexible printed circuit board of claim 13, wherein the base substrate is a patterned flexible copper clad laminate (FCCL), and in the flexible region, the coverlay covers a circuit pattern formed on the base substrate.

* * * * *